United States Patent [19]
Ide et al.

[11] Patent Number: 5,229,658
[45] Date of Patent: Jul. 20, 1993

[54] SWITCHING CIRCUIT

[75] Inventors: Akira Ide; Yoshikazu Saito, both of Takasaki, Japan

[73] Assignee: Hitachi, Ltd., Tokyo, Japan

[21] Appl. No.: 846,779

[22] Filed: Mar. 9, 1992

Related U.S. Application Data

[63] Continuation of Ser. No. 520,524, May 8, 1990, abandoned, which is a continuation of Ser. No. 406,236, Sep. 12, 1989, Pat. No. 4,961,011, which is a continuation of Ser. No. 262,290, Oct. 25, 1988, Pat. No. 4,883,988, which is a continuation of Ser. No. 946,777, Dec. 29, 1986, abandoned.

[30] Foreign Application Priority Data

Dec. 27, 1985 [JP] Japan .................. 60-292667

[51] Int. Cl.$^5$ ............... H03K 19/02; H03K 19/094
[52] U.S. Cl. .................. 307/446; 307/451; 307/570; 330/257; 330/288
[58] Field of Search ........... 307/443, 446, 451, 570; 330/257, 288; 365/230.08

[56] References Cited

U.S. PATENT DOCUMENTS

| | | | |
|---|---|---|---|
| 4,697,109 | 9/1987 | Honma et al. | 307/446 |
| 4,713,796 | 12/1987 | Ogive et al. | 307/446 |
| 4,724,343 | 2/1988 | Le Roux et al. | 307/446 |
| 4,961,011 | 10/1990 | Ide et al. | 307/446 |

Primary Examiner—William L. Sikes
Assistant Examiner—Margaret Rose Wambach
Attorney, Agent, or Firm—Antonelli, Terry, Stout & Kraus

[57] ABSTRACT

A level conversion circuit having a plurality of switching elements connected in series or in parallel to a part thereof and having inputted a plurality of complementary signals to the plurality of switching elements connected in series or in parallel, and a high speed and high driving power switching circuit having a bipolar transistor which is directly driven by an output of such level conversion circuit and which provides level conversion and logic functions.

16 Claims, 5 Drawing Sheets

SWITCHING CIRCUIT

This application is a continuation of application Ser. No. 520,524 filed May 8, 1990 abandoned on Mar. 9, 1992which is a continuation of application Ser. No. 406,236 filed Sept. 12, 1989, now U.S. Pat. No. 4,961,011, which is a continuation of application Ser. No. 262,290 filed Oct. 25, 1988, now U.S. Pat. No. 4,883,988, which is a continuation of application Ser. No. 946,777 filed Dec. 29, 1986, now abandoned on Oct. 26, 1988.

BACKGROUND OF THE INVENTION

The present invention relates to a switching circuit and, for example, to the art which is effective in application to a CMOS type or Bi-CMOS type semiconductor integrated circuit device having level compatibility with an ECL (emitter coupled logic).

Development in the art for combining a bipolar transistor and a complementary MOSFET (CMOS), so-called the BiCMOS technique has made it possible to realize a high speed and low power consumption LSI (large scale integrated circuit device). According to this technique, an LSI which assures high speed operation like a bipolar IC and low power consumption like a CMOSLSI. This art is described, for example, in the magazine, "NIKKEI ELECTRONICS" p187~p208, issued on Aug. 12, 1985 by NIKKEI McGRAWHILL.

SUMMARY OF THE INVENTION

Here, the inventors of the present invention have investigated a level conversion circuit which fits a logic signal output from an ECL type digital circuit to a logic level of the CMOS logic circuit.

FIG. 8 illustrates a structure of a level conversion circuit investigated by the inventors of the present invention.

A level conversion circuit of FIG. 8 consists of a pair of p-channel MOS transistors M1, M2 and a pair of n-channel MOS transistors M3, M4. The n-channel MOS transistors M3 and M4 form a current mirror. Although a mirror input current and mirror output current of this current mirror are respectively supplied from a power supply voltage $V_{cc}$, the p-channel MOS transistors M1 and M2 are respectively provided in series to the current supply paths.

In the circuit of FIG. 8, a pair of differential logic signals A, $\overline{A}$ of ECL level input from an ECL type digital circuit (not illustrated) are distributed for input to each gate of the MOS transistor Ml to which a mirror input current flows and the MOS transistor M2 to which a mirror output current flows. Meanwhile, a logic signal X (X=A) which is level-amplified for fitting to the CMOS logic circuit is outputted from a connecting point (node) of the MOS transistors M2 and M4 in the mirror output side. Namely, the output logic signals A, $\overline{A}$ of the ECL type digital circuit are converted to the logic signal X of CMOS level and then outputted.

An example where the level of signals A, $\overline{A}$ is set to CMOS level in place of the ECL level in the circuit of FIG. 8 is described in the Japanese Laid-Open Patent No. 60-237720.

According to the investigations by the inventors of the present invention, the level conversion circuit explained above provides only the function to convert the level of logic signals. When considering such level conversion circuit only from the viewpoint of signal transmission, it undesirably lowers operation speed of the Bi-CMOS type semiconductor integrated circuit device because it serves as a delay element which delays transmission of signals. Therefore, the existence of this conversion circuit itself is disadvantageous. Moreover, such a level conversion circuit results in a problem that the circuit structure within the semiconductor integrated circuit device is very complicated.

Therefore, it is an object of the present invention to provide a circuit which has a level conversion function and a logic function.

It is another object of the present invention to realize a circuit having such two functions with a simplified circuit structure.

It is a further object of the present invention to provide a circuit which has the two functions explained above and simultaneously assures high speed operation and high output driving ability.

It is a still further object of the present invention to provide a level conversion circuit which assures high speed operation and high output driving ability.

It is also a still further object of the present invention to provide a technique for achieving high performance of a semiconductor integrated circuit device with compatibility of ECL in the input and, or output thereof.

These and other objects and features of the present invention will become apparent from the following description with the preferred embodiment thereof with reference to the accompanying drawings.

A typical disclosure of the present invention among others is briefly explained below.

Two groups of switching elements connected in series or parallel are formed in a part of the level conversion circuit and a plurality of complementary signals are input to the two groups of switching elements connected in series or parallel. Moreover, a bipolar transistor which is directly driven by an output of the level conversion circuit is provided as required.

According to a means described above, a circuit which has the level conversion function and logic function can be attained even in a comparatively simplified circuit. This circuit can improve the transmission rate of the signal transmission system which executes logic processings and remarkably simplifies the circuit structure of such signal transmission system.

Moreover, a circuit obtained assures high speed and high driving ability by direct drive of a bipolar transistor.

DESCRIPTION OF THE PREFERRED EMBODIMENT

Figure 1:
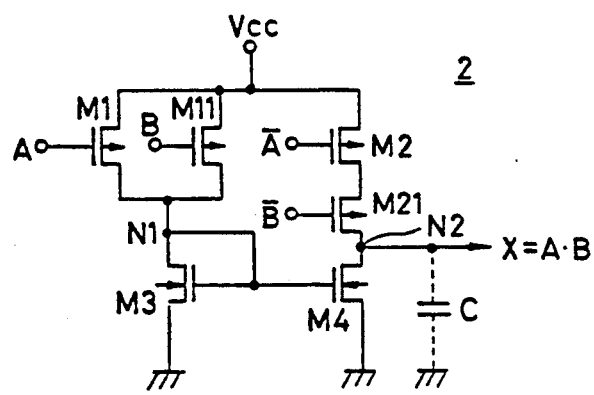
FIG. 1 is a circuit diagram illustrating a first embodiment of the present invention.

A digital circuit 2 illustrated in FIG. 1 comprises a pair of p-channel MOS transistors (FET; Field Effect Transistor) M1, M2 and a pair of n-channel MOS transistors M3, M4. These n-channel MOS transistors M3 and M4 form a current mirror. The sources of MOS transistors M3 and M4 are set to the ground potential. A mirror input side current and mirror output side current of this current mirror are respectively supplied from the positive power supply $V_{cc}$. Namely, the p-channel MOS transistors M1 and M2 are respectively provided in series to each current supply path, namely between the power supply $V_{cc}$ and the input and output nodes N1 and N2 of the current mirror.

Moreover, in this first embodiment, another p-channel MOS transistor M11 is connected in parallel to the p-channel MOS transistor M1 to which a mirror input current flows, in addition to the structure described above. Moreover, another p-channel MOS transistor M21 is connected in series to the p-channel MOS transistor M2 to which a mirror output current flows. Namely, the mirror input side MOS transistor and mirror output side MOS transistor are respectively composed of a plurality of MOS transistor pairs of M1 and M11, M2 and M21. Furthermore, a plurality of MOS transistors are given the following connecting conditions; the one pair of MOS transistors M1 and M11 are connected in parallel and the other pair of MOS transistors M2 and M21 are connected in series.

A plurality of pairs of differential logic signals (complementary signals) A, $\overline{A}$ and B, $\overline{B}$ are input to the gates of both pairs of MOS transistors M1 and M11, M2 and M21. Namely, the digital signals $\overline{A}$ and $\overline{B}$ (the other complementary signals), which are inverted (reverse phase) from the digital signals A and B (the one complementary signals) input to the one pair of MOS transistors (M1, M11), are input to the other pair of MOS transistors (M2, M21). The input logic signals A, $\overline{A}$ and B, $\overline{B}$ are, for example, the differential logic signals of ECL level output from the ECL type digital circuit (not shown) comprising a differential amplifier.

The signal X (=A·B) output from the output node N2 of current mirror is applied as the digital signal of CMOS level because it is level-converted in the circuit 2 including the current mirror and switching circuit.

Figure 4:
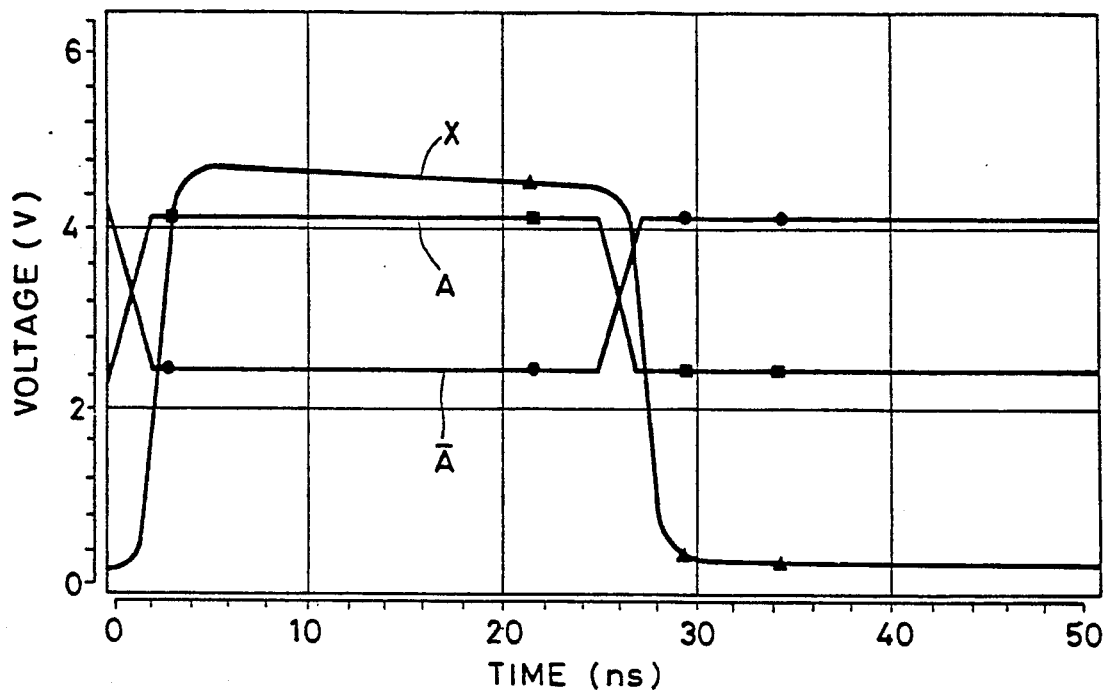
FIG. 4 is examples of operation waveforms of the circuit illustrated in FIG. 3.

The ECL level and CMOS level are indicated in FIG. 4.

In FIG. 1, when logical states of the input logic signals A ($\overline{A}$) and B ($\overline{B}$) are as follow, A="H(high level)" ($\overline{A}$="L (low level)" and B="H"($\overline{B}$="L"), the MOS transistors M1 and M11 are OFF. A mirror input current is cut off and thereby the MOS transistor M4 which allows a mirror output current to flow becomes OFF. Meanwhile, both MOS transistors M2 and M21 to which a mirror output current flows become ON. The output logic signal X output from the connecting point (output node N2) of the MOS transistors M21 and M4 becomes H (high) level because the MOS transistors M2, M21 are ON and MOS transistor M4 is OFF.

When at least one of the input logic signals A and B is "L", at least one of the MOS transistors M1 and M11 becomes ON. Thus, a mirror input current starts to flow and thereby the MOS transistor M4 which allows a mirror output current to flow becomes ON. On the other hand, the series circuit of the MOS transistors M2 and M21 which allows a mirror output current to flow becomes OFF because at least one of MOS transistors M2 and M21 becomes OFF. As a result, an output logic signal X extracted from the output node N2 becomes L (low level).

A digital circuit 2 indicated in FIG. 1 provides a function of a level conversion circuit by a current mirror and the function of a logical AND circuit which executes the logical execution of AND gate (X=A·B) as described above.

Figure 2:
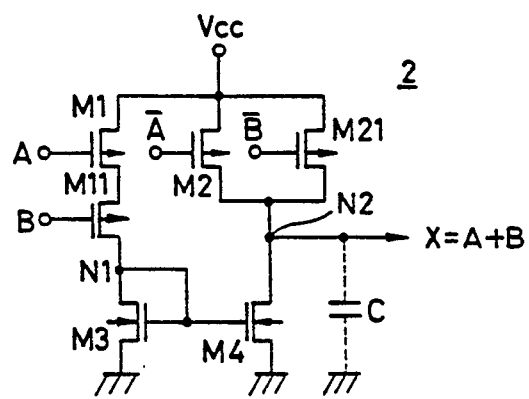
FIG. 2 is a circuit diagram illustrating a second embodiment of the present invention.

FIG. 2 is a digital circuit represented by a second embodiment of the present invention.

A difference from the first embodiment as explained above is now described below. Contrary to the first embodiment, a pair of MOS transistors M1 and M11 on a side where the mirror input current flows (input node N1 side) are connected in series while a pair of MOS transistors M2 and M21 in such a side as the mirror output current flows (output node N2 side) are connected in parallel, respectively in the digital circuit of FIG. 2.

Operations of the second embodiment are as follow. In FIG. 2, when the logical state of the input logic signals A ($\overline{A}$) and B ($\overline{B}$) is as follow; A="L" ($\overline{A}$="H") and B="L" ($\overline{B}$="H"), both MOS transistors M1 and M11 become ON and the MOS transistor M4 which allows a mirror output current to flow becomes ON. On the other hand, both MOS transistors M2 and M21 which allow a mirror output current to flow become OFF. Thereby, an output logic signal X extracted from the connecting point (output node N2) of the MOS transistors M2, M21 and M4 becomes L (low level) because the MOS transistors M2, M21 are OFF and the MOS transistor M4 is ON.

When at least one of input logic signals A and B is "H", any one of the MOS transistors M1 and M11 becomes OFF cutting off a mirror input current. Thereby, the MOS transistor M4 which allows a mirror output current to flow becomes OFF. Meanwhile, the parallel circuit of the MOS transistors M2 and M21 which allow a mirror output current to flow become ON as a whole because any one of the MOS transistors M2 and M21 becomes ON. As a result an output logic signal X is extracted from the output node N2 and becomes H (high level).

As explained above, the digital circuit 2 shown in FIG. 2 provides the function of a level conversion circuit by a current mirror and the function of a logical OR circuit which executes the logical processing of OR gate (X=A+B).

The first and second embodiments provide the functions of level conversion and logic signal processing by a switching circuit having a current mirror. Thereby, transmission delay in the signal transmission system followed by level conversion and logic processings can be reduced, and circuit structure in the signal transmission system can also be simplified remarkably.

The first and second embodiments are capable of processing a plurality of input logic signals at a high speed. For this purpose, an active switching element group, which comprises a plurality of active switching elements for receiving a plurality of input logic signals, is provided respectively to the input and output nodes of a current mirror. A number of switching elements may be determined freely, for example, to two or three as in the case of the first and second embodiments. In case one switching element group consists of n (2 or more) switching elements connected in series (forming a series circuit), the other switching element group is composed of n switching elements connected in parallel (forming a parallel circuit). In addition, both switching element groups are mutually responsive to the reverse signals, namely to the complementary signals. Therefore, potential of the output node (N2) is raised (charged) at a high speed by the switching element group in the output node side, or is lowered (discharged) at a high speed by the switching element group in the input node side and the current mirror, in accordance with a plurality of input logic signals.

As shown in FIG. 1 and FIG. 2, when a capacitive load C is coupled to an output terminal X of the digital circuit 2, since the switching element is composed of an active element, charging or discharging thereof can be realized at a high speed. This charging or discharging is carried out on the basis of the result of processings for a plurality of input logic signals.

Figure 3:
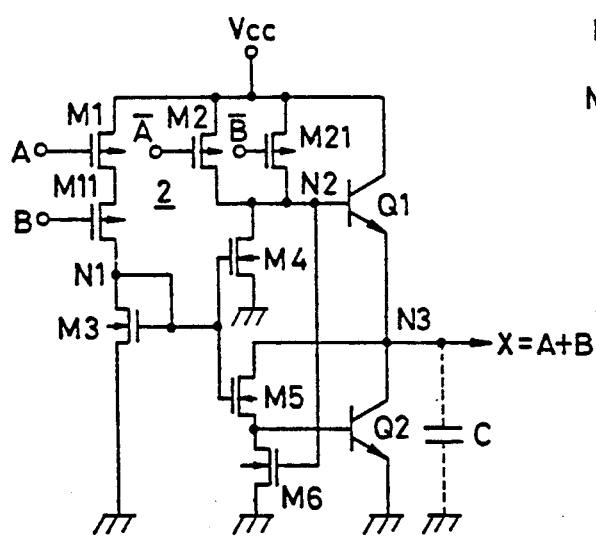
FIG. 3 is a circuit diagram illustrating a third embodiment of the present invention.

FIG. 3 illustrates a digital circuit of a third embodiment of the present invention.

The third embodiment is a Bi-CMOS type logic circuit where a bipolar transistor and CMOS are combined within a logic circuit by adding a bipolar transistor to the CMOS type second embodiment. This embodiment is an example which obtains a high driving power with a bipolar transistor and also realizes high speed operation by directly driving the bipolar transistor from a digital circuit which provides the functions of level shift and logic signal processings.

Like the circuit shown in FIG. 2, the digital circuit shown in FIG. 3 has the function of level conversion to the CMOS level (output signal X) from the ECL level (input signals A, $\bar{A}$, B, $\bar{B}$) and the function of logical OR circuit. The digital circuit of FIG. 3 is provided with an additional drive circuit for an output stage comprising a pair of npn bipolar transistors Q1, Q2 connected in series between a positive power supply $V_{cc}$ and ground potential. Although not limited particularly, it is also provided with additional n-channel MOS transistors M5 and M6. These MOS transistors M5 and M6 operate in such a manner as being forced to extract the residual charges from the base of bipolar transistor Q2. Thereby, the switching speed of transistor Q2 from ON to OFF is enhanced.

The transistor Q1 is controlled through coupling of the output node N2 of the current mirror to the base, working as the control electrode thereof. Namely, the one transistor Q1 of the output stage for charging (or discharging) output capacitor C or outputting a signal which is substantially the same level as the power supply (the one operation potential) is driven by an output of the switching circuit having the level shift function and logic signal processing function.

Moreover, the base of transistor Q1 is directly connected to the node N2. Namely, the transistor Q1 is directly driven by an output of the level conversion circuit which also has the logic function, in place of an output of the level conversion circuit obtained through a logic circuit such as an inverter, etc.

The transistor Q2 is controlled by the signal (complementary signal) which is inversed in the phase to the signal of output node N2 and is supplied to the base as the control electrode. Namely, the other transistor Q2 of the output stage for discharging (or charging) an output capacitor C or outputting a signal which is substantially the same in the level as the ground potential (other operation potential) is driven by the complementary signal of an output of the switching circuit having the level shift function and logic signal processing function. In this embodiment, the complementary signal is supplied, although not particularly limited, by the transistors M5 and M6. Moreover, as described above, switching of transistor Q2 can be realized at a high speed by the transistors M5 and M6.

According to the third embodiment, the transistors Q1 and Q2 provide a high output drive power drivability and realizes high speed operation through direct drive from the level conversion circuit.

Operations of the third embodiment are outlined hereunder. The same signals as those in the second embodiment appear on the nodes N1 and N2 in accordance with the input signals A, $\bar{A}$, B, $\bar{B}$. In case the node N2 is in the high level (the node N1 is in the low level), the transistor Q1 is turned ON and the transistor Q2 which discharges the output capacitor C is turned OFF because the MOS transistor M6 as the means for discharging is turned ON. In this case, the MOS transistor M5 is turned OFF. Thereby, an output X is set to the high level. Meanwhile, when the node N1 is high level (node N2 is low level), the transistor M4 of current mirror is turned ON, the transistor Q1 is turned OFF and when the MOS transistor M5 is turned ON, the transistor Q2 is also turned ON. In this case, the MOS transistor M6 is turned OFF and thereby an output X is set to the low level.

According to the present invention, a Bi-CMOS type logic ciricuit providing the logic function and level conversion function can be formed, where a bipolar and CMOS are combined within a logic circuit. Thereby, the function for level conversion of input logic signal of ECL level to the output signal of CMOS level, the logic processing function, for example, such as predecoder and the function as the high drive power and high speed output buffer can be obtained at a time.

FIG. 4 is an example of the input and output waveforms of the Bi-CMOS type logic circuit shown in FIG. 3.

FIG. 4 illustrates only the one signal A ($\bar{A}$) among two input signals. As is apparent from FIG. 4, the signals A and $\bar{A}$ are complementary signals of ECL level and for example the complementary output signals of the ECL type digital circuit comprising of the differential amplifier. The other signal B ($\bar{B}$) is set to the low level (high level) of the ECL level, although not illustrated. The circuit of FIG. 3 is an OR gate circuit. Therefore, an output signal X is set to the high (low) level in accordance with high (low) level of the input signal A. As will be understood from FIG. 4, the high level or low level of signal X is converted to high level or low level of the CMOS level.

The waveforms of FIG. 4 corresponds to those where an output load capacitance is set to 5 pF and power supply $V_{cc}$ is set to 5 V.

As shown in FIG. 4, a load capacitance as heavy as 5 pF can be driven only with a transmission delay time of about 1 ns (from the timing where the signals A and $\bar{A}$ cross to the timing where the signal X becomes larger than $V_{cc}/2$) and the level conversion and logic processings can also be realized simultaneously in the circuit shown in FIG. 3.

Figure 5:
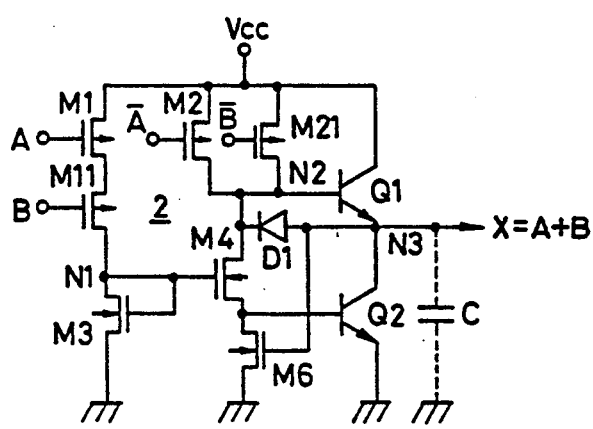
FIG. 5 is a circuit diagram illustrating a fourth embodiment of the present invention.

FIG. 5 is an fourth embodiment of the present invention. The circuit of FIG. 5 is a Bi-CMOS type logic circuit and the drive circuit is formed by the digital circuit 2 shown in FIG. 2 as in the case of the circuit of FIG. 3.

The base of transistor Q1 is directly connected to the node N2 and is controlled in the same way as FIG. 3. Namely, when the node N2 is high level, an output X is set to high level.

A control input of the transistor Q2 is supplied by the MOS transistors M4 and M6 and a diode D1. Namely, when the node N1 changes to high level from low level, the transistor M4 turns ON. Therefore, charges of base of transistor Q1 (charges of node N2) and charges of output capacitor C through the diode D1 (charges of node N3) are supplied as a base current of the transistor Q2. As a result, the transistor Q2 turns ON, the transistor Q1 turns OFF and an output X becomes low level.

In the case of this embodiment, it is possible to assume that an output current path of current mirror is composed of the MOS transistor M4, bipolar transistor Q2 and base charge discharge means of bipolar transistor Q2 (transistor M6). Namely, an output node of current mirror is not N2 but N3 and a bipolar transistor Q1 is connected between the logic circuit (active switching element group) to be connected to the output side of current mirror and the node N3. In other words, the transistor Q1 is an emitter follower transistor where the base-emitter junction is connected btween the nodes N2 and N3.

The fourth embodiment can also provide the effect which is similar to that of the third embodiment explained above.

Figure 6:
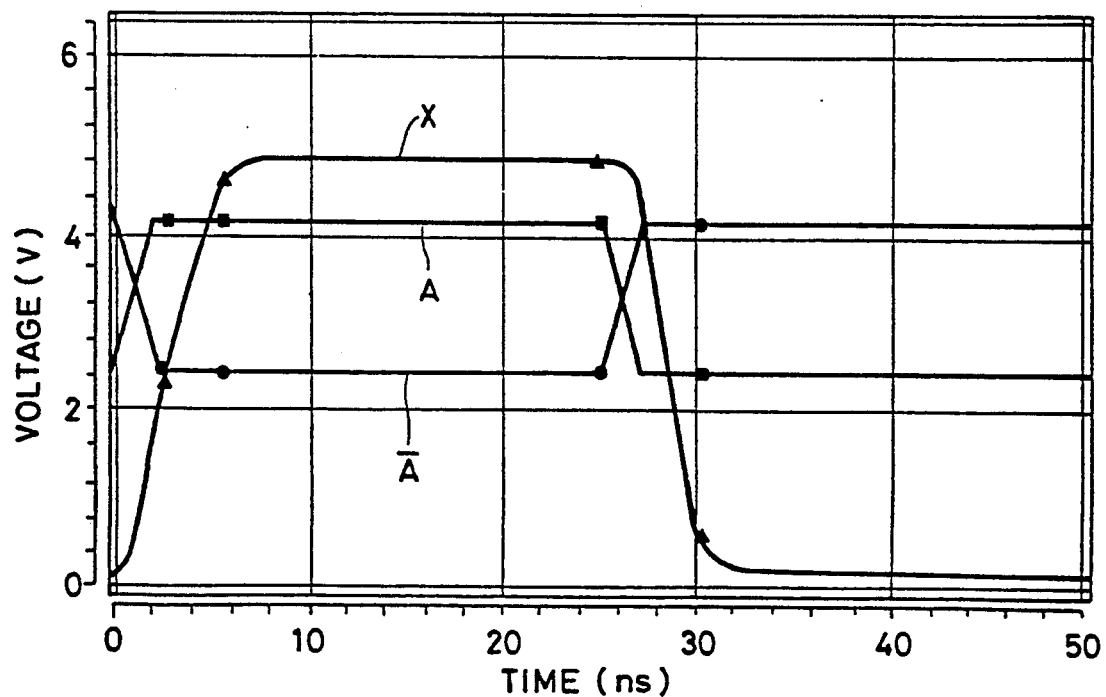
FIG. 6 is examples of operation waveforms of the circuit illustrated in FIG.5.

FIG. 6 is an example of input/output waveforms of the Bi-CMOS type logic circuit shown in FIG. 5.

Under the same operating conditions as FIG. 4, the circuit of FIG. 5 can also drive a load capacitance C as heavy as 5 pF only with a transmission delay time of about 1 ns and realizes level conversion and logic processings at a time.

Figure 7:
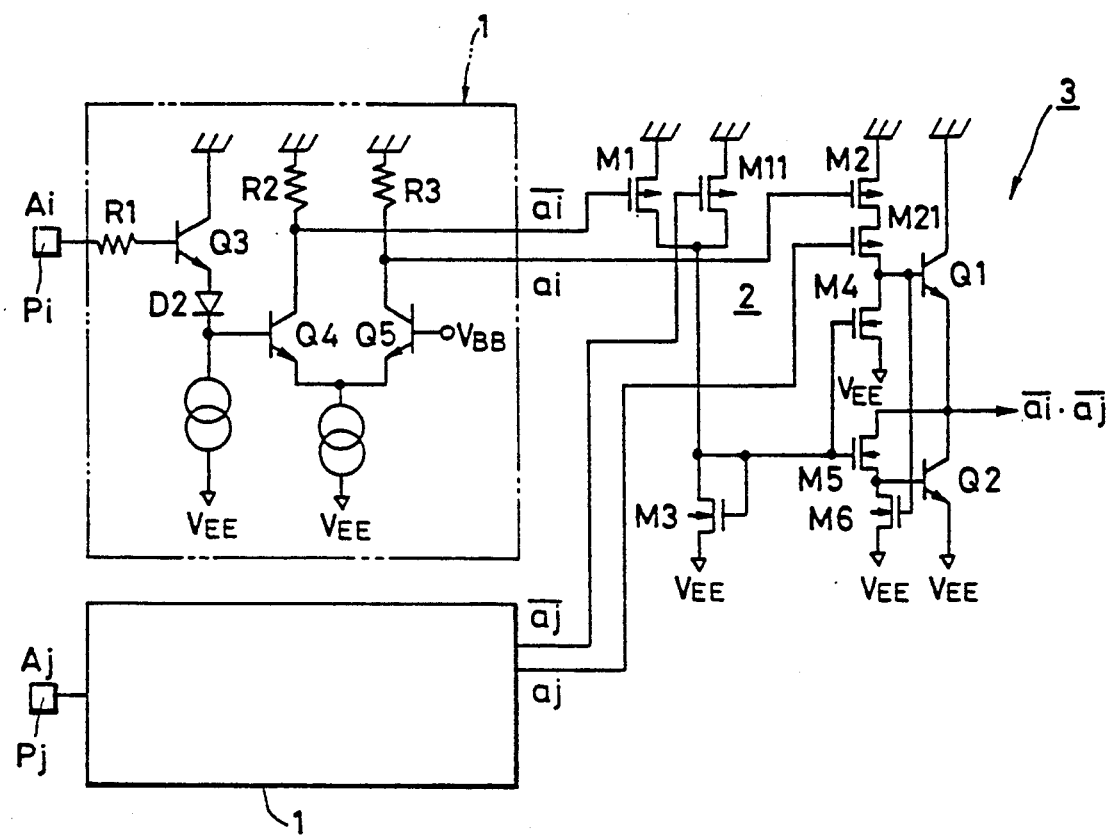
FIG. 7 illustrates another embodiment of the present invention.

FIG. 7 illustrates an example where the present invention is adopted to a Bi-CMOS static RAM which is compatible for ECL level and particularly the circuits covering from the address buffer 1 to the predecoder 3.

In this static RAM, an input/output buffer is formed as the ECL type digital circuit in order to input and output the ECL level signal having small amplitude at a high speed. Namely, as shown in FIG. 7, for example, an input buffer which receives the address signal $A_i$ supplied in the ECL level to the external terminal $P_i$, namely the unit circuit 1 of the address buffer is formed as follow. The address signal $A_i$ is supplied to the base of npn bipolar transistor Q3 for input through a resistor R1. A level shift diode D2 and a constant current source are connected to the emitter of transistor Q3. An output of the diode D2 is supplied to the base of the one differential transistor Q4 of the differential amplifier comprising the resistors R2, R3, npn bipolar transistors Q4, Q5 and the constant current source, etc. Meanwhile, a reference voltage $V_{BB}$ for discriminating address signal is applied to the base of the other differential transistor Q5. Thereby, the internal complementary address signals (differential logic signals) $a_i$, $\bar{a}_i$ of the ECL level are output from the collectors of differential transistors Q5 and Q4. The signals $a_i$ and $\bar{a}_i$ are respectively the in-phase and reversed-phase signals of $A_i$.

The one operation voltage in a high potential as the absolute value is set, for example, to the ground potential, while the other operation voltage is set, for example, to the negative power supply voltage $V_{EE}$.

The internal complementary address signals $a_j$, $\bar{a}_j$ are formed on the basis of the address signal $A_j$ supplied from the other address input terminal $P_j$.

In this static RAM, a memory cell and other almost all circuits (hereinafter referred to as the internal circuits) are, for example, well known CMOS circuits. Therefore, a level conversion circuit which converts ECL level to CMOS level must be provided between the ECL type circuits and the CMOS type circuits.

Moreover, in this static RAM, an address decoder is divided into plural sections for simplification and high speed operation of address decoder. For example, it is divided into a first decoder (predecoder) which receives the internal complementary address signals and a second decoder which receives an output of the predecoder.

In the case of this embodiment, the unit circuit 3 of the predecoder is constituted as follows in order to realize level conversion in the predecoder having an address signal decoding function. Namely, as shown in FIG. 7, the unit circuit 3 has the structure in the circuit shown in FIG. 3, wherein the drive circuit 2 of the output transistors Q1 and Q2 is replaced with the circuit of FIG. 1, in place of the circuit of FIG. 2. Therefore, an output of unit circuit 3 of the predecoder is $\overline{a_i \cdot a_j}$.

According to this embodiment, both functions for level conversion and address decoder can be achieved by a single stage of the Bi-CMOS type logic circuit shown in the same figure.

Therefore, a delay time in the signal transmission system can be reduced and circuit structure can be simplified remarkably.

Figure 8:
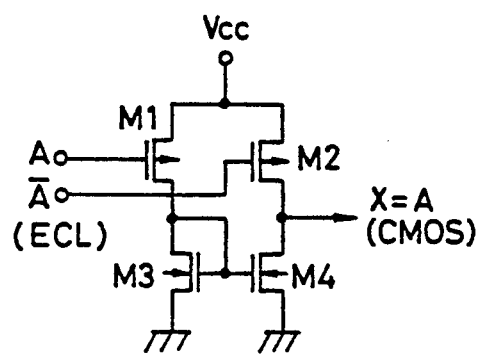
FIG. 8 is a circuit diagram illustrating structure of a a level conversion circuit investigated prior to the present invention.
Figure 9:
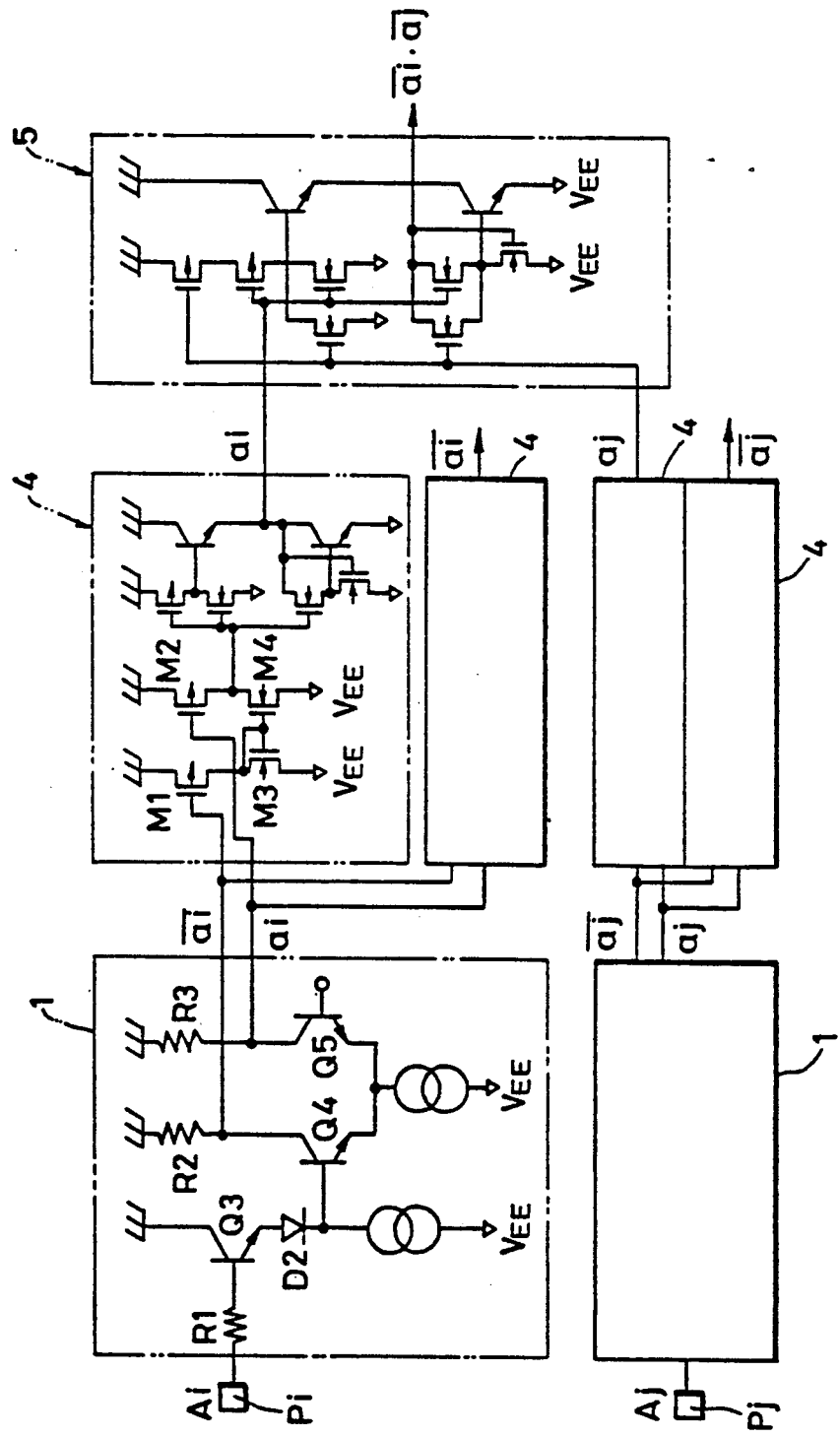
FIG. 9 is a circuit diagram illustrating an application example of the circuit of FIG. 8.

FIG. 9 is an example where the level conversion circuit and predecoder are individually provided, unlike the present invention. Namely, a level conversion circuit 4 and a predecoder 5 are provided in place of the predecoder having the level conversion function. The level conversion circuit 4 is basically composed of the circuit of FIG. 8, with addition of a bipolar transistor and drive circuit in order to drive a heavy load at a high speed. The predecoder 5 comprises the CMOS circuit which decodes the address signals and the bipolar transistor at the output stage. In the circuit of FIG. 9, the internal complementary address signals $a_i$, $\bar{a}_i$ from the address buffer 1 which is the same as the address buffer of FIG. 7 are level-converted to the logic signals of MOS level by the level conversion circuit 4. These level-converted logic signals $a_i$, etc. are processed logically by the predecoder 5.

According to the circuit of FIG. 7, total of 10 transistors is necessary in order to form one predocoded signal $\bar{a}_i \bar{a}_j$, but according to the circuit of FIG. 9, a total of 19 transistors is necessary. It is also true for the other three precoded signals ($a_i \cdot a_j, \bar{a}_i \cdot a_j, a_i \cdot a_j$) corresponding to the address signals $A_i$ and $A_j$.

Therefore, according to this embodiment, a high speed predecoder having a level conversion function can be formed with a simplified circuit structure. Moreover, the area of predecoder, etc. can be narrowed.

In addition, according to this embodiment, a predecoder which can drive a heavy load such as a plurality of second decoders at high speed can be obtained.

The construction of memory arrays and peripheral circuits other than the input buffer and the predecoder of this static RAM is shown in, for example, U.S. Pat. No. 4,429,374 cited as a refference in the specification..

While the present invention has been described with respect to specific embodiments thereof, it is to be understood that the present invention is not limited thereto in any way but covers any and all changes and modifications which will become possible within the scope of the appended claims.

For example, a MOS transistor M3 may be replaced with a resistor.

A MOS transistor may be, for example, a MIS (Metal Insulator Semiconductor) transistor or an IG (Insulated Gate) FET.

A discharging means for the base of bipolar transistor Q2 may be a switching element other than the MOS transistor M6 or resistance element.

A control input signal to the base of transistor Q2 may also be formed by the method other than that described above. For example, it is possible in FIG. 3 and FIG. 7 that a circuit consisting of the transistors corresponding to MOS transistors M1, M11 and M3 be provided and connected to the gate of MOS transistor M5, and the signal be supplied from the connecting point corresponding to the node N1.

The circuit of FIG. 7 can also be formed with the circuit similar to the circuit of FIG. 5.

Figure 10:
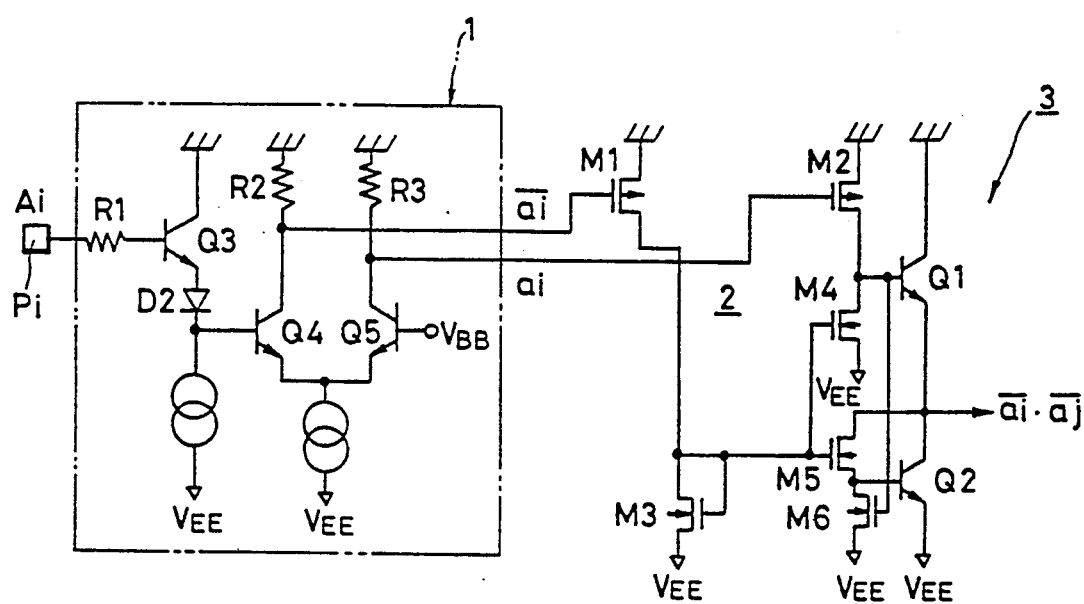
FIG. 10 is a circuit diagram showing a modification of FIG. 7.

In FIGS. 3, 5 and 7, the MOS transistors M11 and M21 may be removed as shown in FIG. 10. In this case, a level conversion circuit which does not have the logic function but has high speed and high output drive power can be obtained. Namely, since the one output bipolar transistor is driven directly with a signal output to the node N2, a high speed and high output drive power can be assured. Moreover, direct drive from the node N2 is also possible by supplying the signal in the reverse phase to the output of node N2 to the other output bipolar transistor.

An effect of the typical disclosure of the present invention will be explained briefly hereunder.

Namely, the logic function can be given to the level conversion circuit and thereby transmission rate of signal transmission system which realizes logic processings can be enhanced and the circuit structure of such transmission system can be simplified remarkably.

The present invention can be applied to an output circuit of a semiconductor integrated circuit and other circuits, in addition to the predecoder circuit and input circuit.

The present invention can certainly be applied to various level conversions between other signal levels such as ECL, CMOS and TTL level, etc. other than conversion from the ECL level to the CMOS level.

The present invention is also effective with a variety of semiconductor integrated circuit device as well as static RAM devices.

What is claimed is:

1. A semiconductor integrated circuit device comprising:
   a first supply terminal;
   a second supply terminal;
   first and second terminals;
   an output terminal;
   a pair of differentially connected bipolar transistors coupled between the first and second supply terminals and having their bases coupled to the first and second terminals, respectively, and having their collectors coupled for providing first and second output signals, respectively;
   a first P-channel MOSFET having a source coupled to the first supply terminal and having a gate coupled to receive a first signal based on the first output signal;
   a second P-channel MOSFET having a source coupled to the first supply terminal, and a gate coupled to receive a second signal based on the second output signal;
   a first N-channel MOSFET having a source coupled to the second supply terminal, and a drain coupled to a drain of the first P-channel MOSFET;
   a second N-channel MOSFET having a source coupled to the second supply terminal, a gate coupled to a gate of the first N-channel MOSFET, and a drain coupled to a drain of the second P-channel MOSFET and to the gate of the first N-channel MOSFET;
   a first bipolar transistor having an emitter-collector path coupled between the first supply terminal and the output terminal and a base directly coupled to the drain of the second P-channel MOSFET, wherein the first bipolar transistor executes one of charging and discharging of a capacitance associated with the output terminal; and
   means coupled between the output terminal and the second supply terminal for executing the other of charging and discharging of the capacitance, the means including a third N-channel MOSFET having a drain coupled to the output terminal and a gate coupled to receive a signal reversed in phase from a signal appearing at the base of the first bipolar transistor.

2. A semiconductor integrated circuit device according to claim 1, wherein said means further comprises a second bipolar transistor having its collector-emitter path coupled between the output terminal and the second supply terminal and its base coupled to a source of the third N-channel MOSFET.

3. A semiconductor integrated circuit device according to claim 2, wherein said means further comprises discharging means coupled between the base of the second bipolar transistor and the second supply terminal.

4. A semiconductor integrated circuit device according to claim 3, wherein the discharging means comprises a fourth N-channel MOSFET having its source-drain path coupled between the base of the second bipolar transistor and the second supply terminal, and having its gate coupled to the base of said first bipolar transistor.

5. A semiconductor integrated circuit device according to claim 3, wherein the discharging means includes a fifth N-channel MOSFET having a source-drain path coupled to the base of the second bipolar transistor and the second supply terminal, and having a gate coupled to the output terminal.

6. A semiconductor integrated circuit device according to claim 3, wherein the gate of the third N-channel MOSFET is coupled to the gate of the second N-channel MOSFET and, wherein the discharging means includes a resistor coupled between the base of the second bipolar transistor and the second supply terminal.

7. A semiconductor integrated circuit device according to claim 3, wherein the pair of differentially connected bipolar transistors, the first bipolar transistor and the second bipolar transistor are of NPN type.

8. A semiconductor integrated circuit device according to claim 3, further comprising:
   a pair of load elements coupled between the respective collectors of the pair of differentially connected bipolar transistors and the first supply terminal; and a current source coupled between emitters of the pair of differentially connected bipolar transistors and the second supply terminal.

9. A semiconductor memory circuit device having level compatibility with an emitter-coupled logic circuit (ECL), and a plurality of external terminals for receiving address signals of the ECL level, the semiconductor memory device comprising:

an internal output terminal;

a first supply terminal;

a second supply terminal;

an input bipolar transistor having a base coupled to one of the plurality of external terminals via a resistance element, and a collector coupled to the first supply terminal;

a first current source coupled between an emitter of the input bipolar transistor and the second supply terminal;

a pair of differentially connected bipolar transistors having their bases arranged so that one is coupled to the emitter of the input bipolar transistor and the other is coupled to receive a reference voltage, and having their collectors coupled for providing first and second output signals;

a first P-channel MOSFET having a source coupled to the first supply terminal and having a gate coupled to receive a first signal based on the first output signal;

a second P-channel MOSFET having a source coupled to the first supply terminal, and a gate coupled to receive a second signal based on the second output signal;

a first N-channel MOSFET having a source coupled to the second supply terminal, and a drain coupled to a drain of the first P-channel MOSFET;

a second N-channel MOSFET having a source coupled to the second supply terminal, a gate coupled to a gate of the first N-channel MOSFET, and a drain coupled to a drain of the second P-channel MOSFET and to the gate of the first N-channel MOSFET;

a first bipolar transistor having an emitter-collector path coupled between the first supply terminal and the output terminal and a base directly coupled to the drain of the second P-channel MOSFET, wherein the first bipolar transistor executes one of charging and discharging of a capacitance associated with the output terminal; and means coupled between the output terminal and the second supply terminal for executing the other of charging and discharging of the capacitance, the means including a third N-channel MOSFET having a drain coupled to the output terminal and a gate coupled to receive a signal reversed in phase from a signal appearing at the base of the first bipolar transistor.

10. A semiconductor memory circuit device according to claim 9, wherein said means further comprises a second bipolar transistor having its collector-emitter path coupled between the output terminal and the second supply terminal and its base coupled to a source of the third N-channel MOSFET.

11. A semiconductor memory circuit device according to claim 10, wherein said means further comprises discharging means coupled between the base of the second bipolar transistor and the second supply terminal.

12. A semiconductor memory circuit device according to claim 11, wherein the discharging means comprises a fourth N-channel MOSFET having its source-drain path coupled between the base of the second bipolar transistor and the second supply terminal, and having its gate coupled to the base of said first bipolar transistor.

13. A semiconductor memory circuit device according to claim 11, wherein the discharging means includes a fifth N-channel MOSFET having a source-drain path coupled to the base of the second bipolar transistor and the second supply terminal, and having a gate coupled to the output terminal.

14. A semiconductor memory circuit device according to claim 11, wherein the gate of the third N-channel MOSFET is coupled to the gate of the second N-channel MOSFET, and wherein the discharging means includes a resistor element coupled between the base of the second bipolar transistor and the second supply terminal.

15. A semiconductor memory circuit device according to claim 11, wherein the pair of differentially connected bipolar transistors, the first bipolar transistor and the second bipolar transistor are of NPN type.

16. A semiconductor memory circuit device according to claim 11, further comprising:

a pair of load elements coupled between the respective collectors of the pair of differentially connected bipolar transistors and the first supply terminal; and a second current source coupled between emitters of the pair of differentially connected bipolar transistors and the second supply terminal.

* * * * *